(12) United States Patent
Sim et al.

(10) Patent No.: US 11,552,623 B2
(45) Date of Patent: Jan. 10, 2023

(54) DEVICE AND METHOD OF GENERATING NONLINEAR WAVEFORM SIGNAL

(71) Applicant: POSTECH Research and Business Development Foundation, Pohang-si (KR)

(72) Inventors: Jae Yoon Sim, Pohang-si (KR); Ki Seo Kang, Seoul (KR)

(73) Assignee: POSTECH Research and Business Development Foundation, Pohang-si (KR)

( * ) Notice: Subject to any disclaimer, the term of this patent is extended or adjusted under 35 U.S.C. 154(b) by 0 days.

(21) Appl. No.: 17/560,090

(22) Filed: Dec. 22, 2021

(65) Prior Publication Data

US 2022/0209755 A1 Jun. 30, 2022

(30) Foreign Application Priority Data

Dec. 28, 2020 (KR) .................. 10-2020-0184736

(51) Int. Cl.
| | | |
|---|---|---|
| *H03K 5/00* | (2006.01) | |
| *H03K 4/02* | (2006.01) | |
| *H03K 5/01* | (2006.01) | |
| *H03M 1/66* | (2006.01) | |
| *H03K 4/92* | (2006.01) | |

(52) U.S. Cl.
CPC .............. *H03K 4/026* (2013.01); *H03K 4/92* (2013.01); *H03K 5/01* (2013.01); *H03M 1/66* (2013.01)

(58) Field of Classification Search
None
See application file for complete search history.

(56) References Cited

U.S. PATENT DOCUMENTS

| | | | |
|---|---|---|---|
| 9,397,677 B1* | 7/2016 | Abramzon | H03M 1/1033 |
| 9,991,900 B1* | 6/2018 | Kabir | H03M 1/0673 |
| 10,627,582 B2* | 4/2020 | Shimakawa | G02B 6/3861 |
| 2002/0008651 A1 | 1/2002 | Bugeja et al. | |
| 2003/0201924 A1 | 10/2003 | Lakshmikumar et al. | |
| 2008/0100487 A1* | 5/2008 | Tsai | H03M 1/0641 |
| | | | 341/144 |
| 2008/0252501 A1 | 10/2008 | Mechnig | |
| 2019/0181879 A1 | 6/2019 | Zhang | |

FOREIGN PATENT DOCUMENTS

| | | |
|---|---|---|
| KR | 10-0311043 B1 | 9/2001 |
| KR | 10-0550102 B1 | 2/2006 |

\* cited by examiner

*Primary Examiner* — Tuan T Lam (74) *Attorney, Agent, or Firm* — Morgan, Lewis & Bockius LLP (57) ABSTRACT

The present disclosure provides a device and method of generating a nonlinear waveform signal dissipating low power and operating at a high speed. The device includes: a digital preprocessing unit configured to quantize an effective input signal to generate a linear data signal and a residual signal that is a difference between the effective input signal and the linear data signal; a nonlinear digital-to-analog conversion circuit (DAC) having a nonlinear relationship between an input and an output and configured to convert the linear data signal into a first analog signal; a linear interpolation DAC configured to convert the residual signal into a second analog signal to enable a generation of a converted analog signal by an addition of the second analog signal to the first analog signal; and an output circuit configured to output the converted analog signal as a nonlinear waveform signal.

19 Claims, 9 Drawing Sheets

DEVICE AND METHOD OF GENERATING NONLINEAR WAVEFORM SIGNAL

CROSS-REFERENCE TO RELATED APPLICATION

The present application claims a convention priority to Korean Patent Application No. 10-2020-0184736 filed on Dec. 28, 2020, with the Korean Intellectual Property Office (KIPO), the entire content of which is incorporated herein by reference.

BACKGROUND

1. Technical Field

The present disclosure relates to a device and method of generating a signal and, more particularly, to a device and method of generating a nonlinear periodic signal.

2. Related Art

Recent advances in quantum computing have revealed disruptive potential of quantum supremacy but also presented challenges in building a microsystem capable of controlling millions of physical qubits required for fault tolerant scalable quantum computers. Benefited from the CMOS technology which has been proved to stably operate at cryogenic temperatures, the design of integrated circuit (IC) interfacing with quantum processor becomes an essential part for the realization of the scalable quantum computer. A transmon which is a superconductor LC circuit based on a Josephson junction may be one of the most promising solid state qubits.

Figure 1:
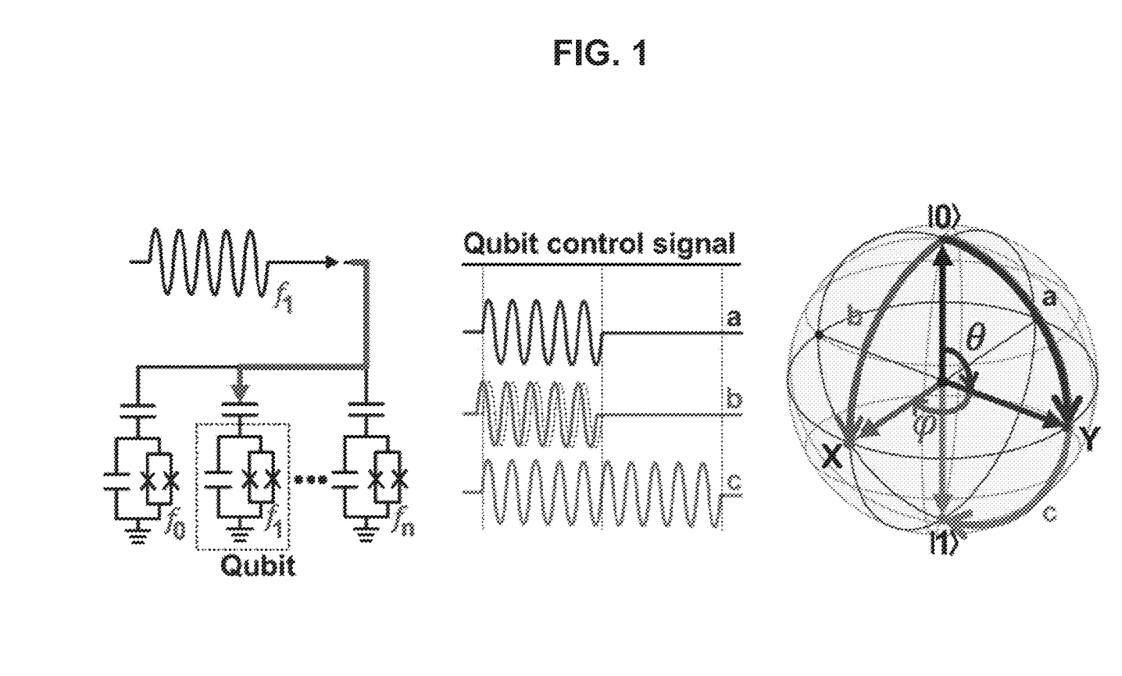
FIG. 1 illustrates a Bloch sphere representation of a transmon qubit operation.

As shown in FIG. 1, qubit operations can be understood as rotations in a Bloch sphere, where a top and bottom points may be represented by $|0\rangle$ and $|1\rangle$ states, respectively. A rotation of the state may be performed by applying a microwave pulse to the transmon. The required microwave frequency is in a range of around 4-7 gigahertz (GHz). A frequency of each qubit is uniquely given by $(E1-E0)/h$, where $E1$, $E0$, and $h$ represent energies for the states $|1\rangle$ and $|0\rangle$, and Planck's constant, respectively. The rotation axis on an XY plane is set by a phase ($\varphi$) of the microwave. An amplitude and duration of the microwave pulse determine a rotation angle ($\theta$). A pulse width required for a gate operation is in an order of 10-1000 nanoseconds (ns) depending on a power level of the microwave signal. Thus, in order for an interface apparatus for the quantum processor to the control the qubit, it is necessary to generate a burst having a same frequency as the unique frequency of the qubit as well as a precise phase.

Figure 2A:
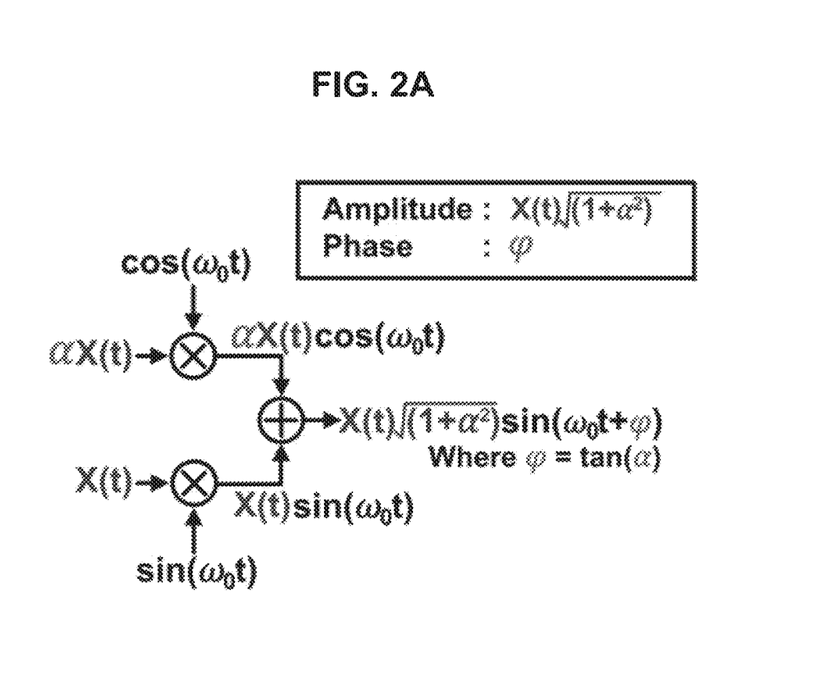
FIG. 2A shows a pulse waveform shaping method and FIG. 2B shows a direct synthesis method.
Figure 2B:
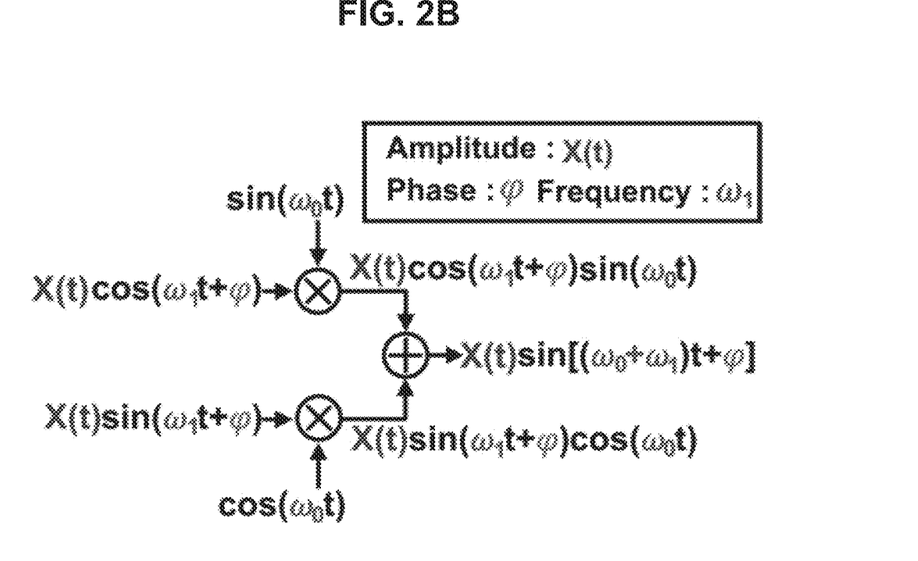

Many attempts have been made for the IC implementation of the cryogenic qubit controller. Microwave pulse generation methods presented so far shapes a waveform of a local oscillator (LO) output as shown in FIG. 2A or directly synthesize the microwave pulse as shown in FIG. 2B. Though the pulse waveform shaping method showed a feasibility of the cryogenic pulse modulation for the first time, the method works only at a given LO frequency and has a limitation in the scalability because each qubit requires a separate LO. On the other hand, the direct synthesis allows to generate a signal of an arbitrary frequency through a synthesis of mixing outputs of an LO and a digital-to-analog converter (DAC). This approach enables the generation of the burst with a full configurability in the frequency, phase, amplitude, and pulse width.

However, an increase in the circuit complexity caused by considerations of synthesizability and programmability may decrease the operation speed of the circuit and increase the power dissipation of the circuit. In detail, in order to generate a nonlinear waveform, an input value for the nonlinear waveform is stored in a memory and sequentially supplied to the DAC to generate an analog output signal. To increase an output resolution, however, it is necessary to increase the resolution of the DAC, which requires to subdivide a current source in the DAC and connect more metal lines to an output node. As a result, a parasitic capacitance in the metal line increases and the operation speed of the circuit decreases, which also leads to a decrease in the frequency range of the nonlinear signal. Meanwhile, the increase in the output resolution requires a larger memory space for storing nonlinear values to be read out sequentially for each output frequency as well as more data transmission lines in proportion to the number of word bits. Accordingly, the memory, the current source, and the data transmission lines occupy larger area on the IC chip dissipates lots of power.

A stringent limitation on the allowable power dissipation to keep the cryogenic temperature may be a serious challenge even if any possible changes in the future are taken into account. It can be said that a power dissipation level of less than 1 milliwatt per qubit (mW/qubit) at 4 K for 1000 qubits, for example, is required as a first step towards a fault-tolerant scalable quantum computer.

SUMMARY

Provided is a device for generating a nonlinear waveform signal dissipating low power and operating at a high speed.

Also, provided is a method of generating a nonlinear waveform signal at a high speed with low power.

According to an aspect of an exemplary embodiment, provided is a nonlinear waveform signal generating device. The nonlinear waveform signal generating device includes: a digital preprocessing unit configured to quantize an effective input signal to generate a linear data signal and a residual signal that is a difference between the effective input signal and the linear data signal; a nonlinear digital-to-analog conversion circuit (DAC) having a nonlinear relationship between an input and an output and configured to convert the linear data signal into a first analog signal; a linear interpolation DAC configured to convert the residual signal into a second analog signal to enable a generation of a converted analog signal by an addition of the second analog signal to the first analog signal; and an output circuit configured to output the converted analog signal as a nonlinear waveform signal.

The nonlinear DAC may include: a reference current source; and a plurality of current sources each being activated according to a corresponding bit of a thermometer code, wherein a number of the current sources is the same as a number of bits of thermometer code for the linear data signal and output currents of at least some of the plurality of current sources are different from each other. The linear interpolation DAC may be connected to one of the plurality of current sources at a first activated position or a last deactivated position.

The linear interpolation DAC may provide the second analog signal to the nonlinear DAC for an interpolation of a single step of the linear data signal.

The nonlinear waveform signal generating device may further include a waveform shaping circuit configured to shaping a waveform of the converted analog signal.

The nonlinear waveform signal generating device may further include a mixer configured to perform a frequency modulation of the converted analog signal by mixing the converted analog signal with a local oscillation signal.

The nonlinear waveform signal generating device may further include a raised cosine code generator configured to provide a raised cosine code to the waveform shaping circuit. The waveform shaping circuit may include a shunt circuit configured to shunt a signal line of the converted analog signal according to bits of the raised cosine code.

The nonlinear waveform signal generating device may further include a rotational phase accumulator configured to generate the effective input signal based on an initial phase value and a frequency codeword input by a user.

The rotational phase accumulator may generate rotationally accumulated values, as the effective input signal, that are calculated by repeatedly adding the frequency codeword within a predetermined phase value range starting from the initial phase value. The nonlinear waveform signal generating device may further include a symmetric transformation unit configured to perform a symmetric transformation on the rotationally accumulated value in a predetermined bi-periodic unit with respect to a half level of a maximum value of the rotationally accumulated value to facilitate an acquisition of the linear data signal from a symmetrically transformed signal.

The rotational phase accumulator may generate the effective input signal by taking only a certain number of most significant bits from a rotationally accumulated value that is calculated by repeatedly adding the frequency codeword within a predetermined phase value range starting from the initial phase value. The linear data signal may be obtained by newly quantizing the effective input signal.

According to another aspect of an exemplary embodiment, provided is a method of generating a nonlinear waveform signal. The method of generating the nonlinear waveform signal may include: (a) generating an effective input signal repeatedly increasing within a predetermined range at a regular time interval starting from an initial phase value input by a user; (b) quantizing the effective input signal to obtain a linear data signal and a residual signal that is a difference between the effective input signal and the linear data signal; (c) converting the linear data signal into a first analog signal by a nonlinear DAC having a nonlinear relationship between an input and an output, converting the residual signal into a second analog signal, and adding the second analog signal to the first analog signal to generate the converted analog signal; and (d) outputting the converted analog signal as a nonlinear waveform signal.

The second analog signal may be generated for an interpolation of a single step of the linear data signal.

The nonlinear DAC may include a plurality of current sources each being activated according to a corresponding bit of a thermometer code. A number of the current sources may be the same as a number of bits of thermometer code for the linear data signal and output currents of at least some of the plurality of current sources may be different from each other. The operation (c) may include adding the second analog signal to a fractionalized path of a selected one of the current sources.

The method of generating the nonlinear waveform signal may further include: (e) shaping a waveform of the converted analog signal.

The operation (e) may include: performing a frequency modulation of the converted analog signal by mixing a local oscillation signal to the converted analog signal; and shaping a waveform of a frequency-modulated signal by a raised cosine filtering of the frequency-modulated signal. The shaping of the waveform of the frequency-modulated signal may include an operation of shunting a signal line of the converted analog signal according to bits of a raised cosine code.

The operation (a) may include an operation of generating rotationally accumulated values, as the effective input signal, that are calculated by repeatedly adding the frequency codeword input by the user starting from the initial phase value. The operation (a) may further include operations of taking only a certain number of most significant bits from the rotationally accumulated value, and performing a symmetric transformation on the rotationally accumulated value with respect to a half level of a maximum value of the rotationally accumulated value.

The device for generating a nonlinear waveform signal according to an exemplary embodiment of the present disclosure may generate the nonlinear waveform signal at a high operating speed with low power consumption by combining the nonlinear DAC and the linear interpolation DAC. In particular, the device for generating a nonlinear waveform signal according to an exemplary embodiment of the present disclosure can maintain a high resolution despite of its simple circuit configuration and lower power consumption and heat generation.

Non-uniform quantization levels in the nonlinear DAC may be set arbitrarily, and their settings may be implemented easily by varying aspect ratios of the transistors constituting current sources during a semiconductor design process. The nonlinear waveform signal generating device implemented as described above may generate signals of various nonlinear waveforms such as a square wave and a ramp waveform as well as a sine wave.

As described above, the nonlinear waveform signal generating device of the present disclosure having improved characteristics in both energy efficiency and hardware efficiency may be manufactured in a form of a cryogenic qubit controller IC and may be applied to a quantum computer.

In addition, the application of the nonlinear waveform signal generating device of the present disclosure is not limited to the quantum computer, but the nonlinear waveform signal generating device is applicable to various other devices that require the generation of the nonlinear waveform signal.

BRIEF DESCRIPTION OF THE DRAWINGS

In order that the disclosure may be well understood, there will now be described various forms thereof, given by way of example, reference being made to the accompanying drawings, in which:

FIGS. 2A and 2B illustrate pulse generation methods for qubit control in conventional quantum computers, in which

The drawings described herein are for illustration purposes only and are not intended to limit the scope of the present disclosure in any way.

DETAILED DESCRIPTION

For a more clear understanding of the features and advantages of the present disclosure, exemplary embodiments of the present disclosure will be described in detail with reference to the accompanied drawings. However, it should be understood that the present disclosure is not limited to particular embodiments disclosed herein but includes all modifications, equivalents, and alternatives falling within the spirit and scope of the present disclosure. In the drawings, similar or corresponding components may be designated by the same or similar reference numerals.

The terminologies including ordinals such as "first" and "second" designated for explaining various components in this specification are used to discriminate a component from the other ones but are not intended to be limiting to a specific component. For example, a second component may be referred to as a first component and, similarly, a first component may also be referred to as a second component without departing from the scope of the present disclosure. As used herein, the term "and/or" may include a presence of one or more of the associated listed items and any and all combinations of the listed items.

When a component is referred to as being "connected" or "coupled" to another component, the component may be directly connected or coupled logically or physically to the other component or indirectly through an object therebetween. Contrarily, when a component is referred to as being "directly connected" or "directly coupled" to another component, it is to be understood that there is no intervening object between the components. Other words used to describe the relationship between elements should be interpreted in a similar fashion.

The terminologies are used herein for the purpose of describing particular exemplary embodiments only and are not intended to limit the present disclosure. The singular forms include plural referents as well unless the context clearly dictates otherwise. Also, the expressions "comprises," "includes," "constructed," "configured" are used to refer a presence of a combination of stated features, numbers, processing steps, operations, elements, or components, but are not intended to preclude a presence or addition of another feature, number, processing step, operation, element, or component.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having meanings consistent with their meanings in the context of related literatures and will not be interpreted as having ideal or excessively formal meanings unless explicitly defined in the present application.

In describing the present disclosure, in order to facilitate an overall understanding thereof, the same components are assigned the same reference numerals in the drawings and are not redundantly described here.

Figure 3:
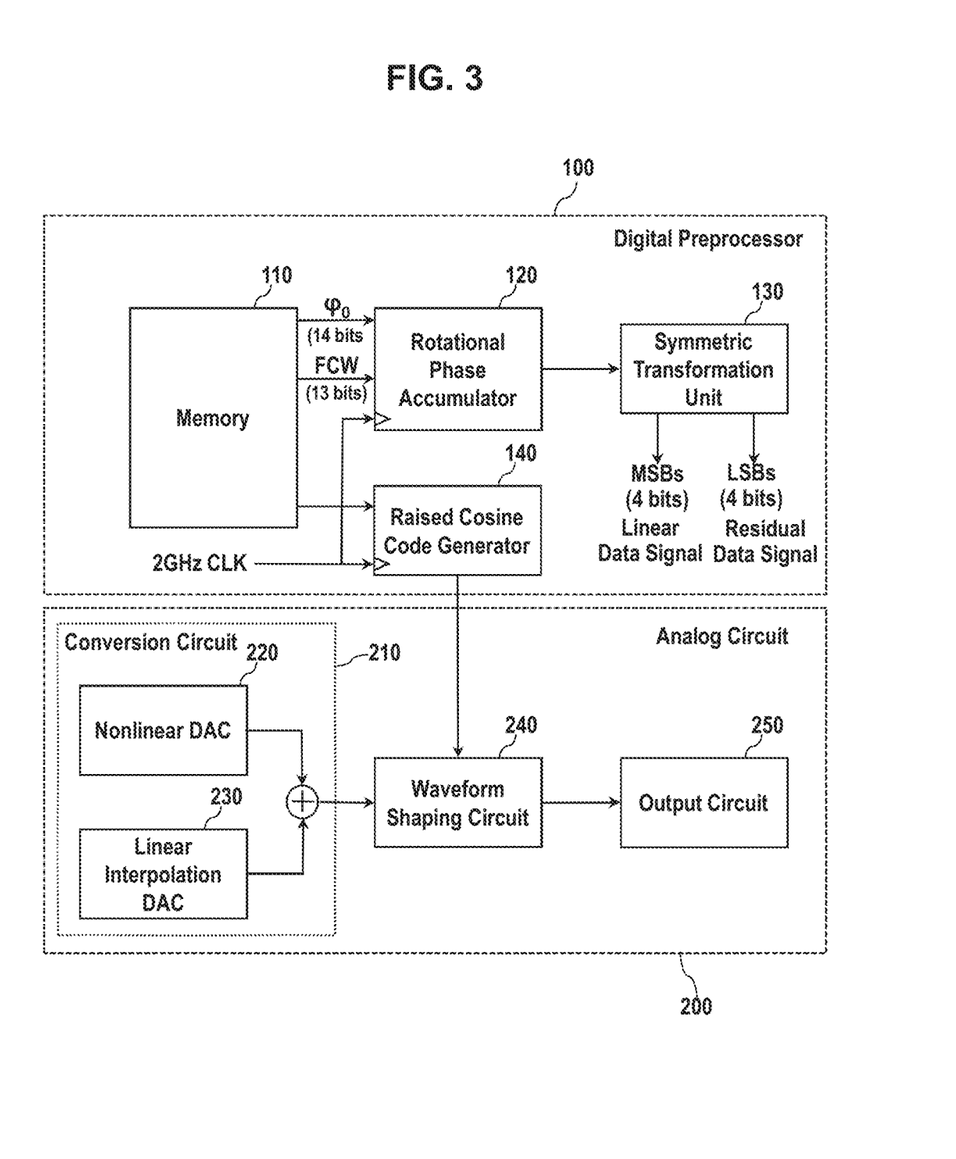
FIG. 3 is a functional block diagram of a nonlinear waveform signal generating device according to an exemplary embodiment of the present disclosure.

FIG. 3 is a functional block diagram of a nonlinear waveform signal generating device according to an exemplary embodiment of the present disclosure. The nonlinear waveform signal generating device includes a digital preprocessor 100 suitable for supplying a digital signal value and a control input signal for generating a waveform and an analog circuit 200 suitable for converting the digital signal value into an analog signal based on the control input signal. The digital preprocessor 100 includes a memory 110, a rotational phase accumulator 120, a symmetric transformation unit 130, and a raised cosine code generator 140. Meanwhile, the analog circuit 200 includes a conversion circuit 210 having a nonlinear digital-to-analog converter (DAC) 220 and a linear interpolation DAC 230, a waveform shaping circuit 240, and an output circuit 250.

The memory 110 may store information needed for the operation of the nonlinear waveform signal generating device such as frequency codewords (FCWs), phase, pulse width, pulse shape, and single sideband (SSB) selection information. All or some of the information stored in the memory 110 may be preset by a user before the operation of the nonlinear waveform signal generating device or may be input during the operation of the nonlinear waveform signal generating device. Some of the information stored in the memory 110 may be set during a manufacture of the nonlinear waveform signal generating device. In an exemplary embodiment, at least some portion of the memory 110 may include 14-bit memory spaces storing data in a unit of a word comprised of fourteen bits. However, the present disclosure is not limited thereto, and the number of bits in a word may not be fourteen.

Figure 4:
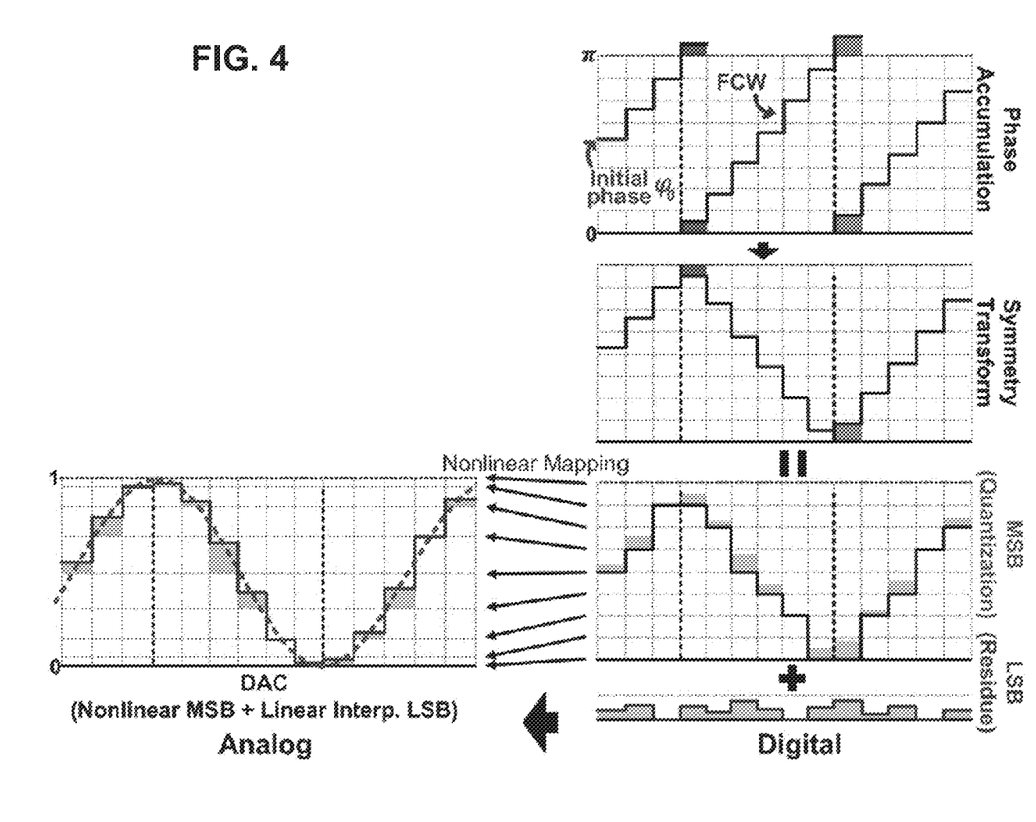
FIG. 4 is a waveform diagram showing an example of output signals of circuits in the nonlinear waveform signal generating device of FIG. 3.

The rotational phase accumulator 120 receives an initial phase value φ0 from the memory 110, and then sequentially reads frequency codeword (FCW) from the memory 110 to accumulatively add the frequency codeword from the initial phase value (φ0) as shown in FIG. 4. The frequency codewords are factors determining a frequency of the nonlinear waveform, as will be described later, and may be originally input by the user. The accumulation of the frequency codeword is repeatedly carried out until an accumulated value reaches a certain upper limit. When the accumulated value reaches the upper limit, the rotational phase accumulator 120 subtracts the upper limit from the accumulated value and continues to accumulate the frequency codeword from a remaining value after the subtraction. Accordingly, the accumulated value is repeatedly increased from around zero to slightly above the upper limit. In this specification including the appended claims, the accumulated value which repeatedly increases to around the upper limit is referred to as a 'rotationally accumulated value.'

In an exemplary embodiment, the magnitude of the rotationally accumulated value is related to the phase of the nonlinear waveform signal generated by the nonlinear waveform signal generating device, and the upper limit of the rotationally accumulated value corresponds to a half of the phase variation range of the nonlinear waveform. That is, in case that the nonlinear waveform signal generated in the present embodiment is a sinusoidal wave, the upper limit may be $\pi$ as shown in FIG. 4, and the rotationally accumulated value repeats rises from around zero to around $\pi$. The phase in an interval $[\pi, 2\pi]$ corresponding to a remaining interval in a period of the sinusoidal wave may be obtained by a symmetric transformation performed by the symmetric transformation unit 130 as described below.

The symmetric transformation unit 130 receives the rotationally accumulated value from the rotational phase accumulator 120 and performs the symmetric transformation. In an exemplary embodiment, the symmetric transformation may be an operation that inverts the rotationally accumulated value every other period. That is, in the example of FIG. 4, the symmetric transformation may be performed by inverting the rotationally accumulated values of even-numbered rising intervals with respect to a level of π/2 which may be an average of the maximum and minimum values while leaving the rotationally accumulated values of the odd-numbered rising intervals as they are. Accordingly, a symmetry transformed value output by the symmetric transformation unit 130 has a waveform falling π to zero in the even-numbered rising intervals of the rotationally accumulated value. As a result, the output signal of the rotational phase accumulator 120, which generally had a shape of a sawtooth wave before the symmetric transformation generally, has a waveform of a triangular wave after the symmetric transformation.

The symmetric transformation unit 130 outputs upper four bits of the symmetry transformed value to the nonlinear DAC 220 as a linear data signal to be converted into an analog signal. Also, the symmetric transformation unit 130 outputs lower four bits of the symmetry transformed value to the linear interpolation DAC 230 as a residual signal, so that the linear interpolation DAC 230 converts the residual signal into an analog interpolation signal.

The raised cosine code generator 140 may generate a raised cosine code for a raised cosine filtering to provide to the waveform shaping circuit 240.

In the digital preprocessor 100, the portion of the memory 110 used for calculating the rotationally accumulated value may be a 14-bit memory as mentioned above, and the initial phase value φ0 supplied by the memory 110 to the rotational phase accumulator 120 may also have a length of fourteen bits. Contrarily, each frequency codeword supplied by the memory 110 to the rotational phase accumulator 120 every clock cycle to be accumulated in the rotational phase accumulator 120 may have a smaller number of bits than the initial phase value (φ0). For example, each frequency codeword may have a length of thirteen bits. Meanwhile, according to another exemplary embodiment of the present disclosure, the rotational phase accumulator 120 may output only the upper eight bits of the 14-bit rotationally accumulated value to the symmetric transformation unit 130 and discard the remaining lower six bits to simplify the configuration of the analog circuit 200. In the following description, data of a certain number of bits used by the rotational phase accumulator 120 and the symmetric transformation unit 130 will be referred to as an 'effective input signal.' On the other hand, the raised cosine code output by the raised cosine code generator 140 may have a length of eleven bits. Although the number of bits serving as a unit in the data processing may be different for each member as above, the numbers are presented only for an example, and the present disclosure is not limited thereto.

Extraction of only the upper four bits of the effective input signal after the symmetric transformation of the symmetric transformation unit 130 as the linear data signal for the conversion into the analog signal results in a kind of quantization. In addition, the lower four bits of the effective input signal, i.e. the residual signal, correspond to a difference between the effective input signal and the linear data signal and represent a residue or an error after the quantization.

Meanwhile, in the conversion circuit 210 of the analog circuit 200, the nonlinear DAC 220 receives the linear data signal, i.e. the upper four bits of the effective input signal after the symmetric transformation, to convert into an analog linear signal. The linear interpolation DAC 230 receives the residual signal, i.e. the lower four bits of the effective input signal after the symmetric transformation, to convert into an analog residual signal. The analog residual signal from the linear interpolation DAC 230 is added to the analog linear signal from the nonlinear DAC 220 to interpolate the analog linear signal from the nonlinear DAC 220. The conversion circuit 210 may output an interpolated signal resulting from the addition of the analog residual signal to the analog linear signal as the converted analog signal.

The waveform shaping circuit 240 shapes the waveform of the converted analog signal output by the conversion circuit 210 for a better spectral isolation between pulses. According to an exemplary embodiment of the present disclosure, the waveform shaping circuit 240 performs a shunt-based amplitude waveform shaping that approximates the converted analog signal by a discrete cosine function for a case of a higher roll-off coefficient is high (i.e. close to 1) to simplify a circuit implementation.

The output circuit 250 may filter a waveform-shaped analog signal from the waveform shaping circuit 240 to output a filtered signal as an output voltage RF_OUT, that is, a nonlinear waveform signal.

Figure 5:
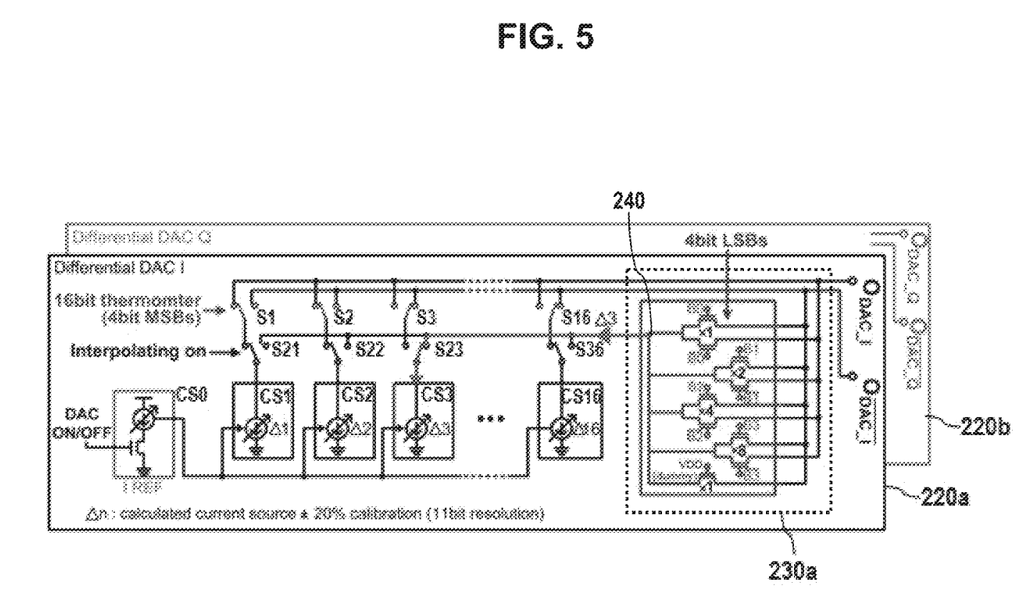
FIG. 5 is a circuit diagram of a conversion circuit according to an exemplary embodiment of the present disclosure.

FIG. 5 is a circuit diagram of the conversion circuit 210 according to an exemplary embodiment of the present disclosure.

In the conversion circuit 210, the nonlinear DAC 220 has a shape of a differential circuit which calculates an in-phase signal (I-component signal) and a quadrature-phase signal (Q-component signal) separately. The nonlinear DAC 220 includes an in-phase DAC 220A and a quadrature DAC 220B. Since the quadrature DAC 220B has the same configuration as the in-phase DAC 220A, the nonlinear DAC 220 will be described below in terms of the in-phase DAC 220A.

The nonlinear in-phase DAC 220A may include a reference current source CS0 through which a reference current flows and sixteen current sources CS1-CS16. A field effect transistor (FET) in each of the current sources CS1-CS16 has a gate connected to a drain of an FET in the reference current source CS0m and a source connected to ground. Drains of the FETs in the current sources CS1-CS16 may be connected to an output terminal ODAC_I or to an inverted output terminal /ODAC_I directly or through the linear interpolation DAC 230A according to switching positions of first switches S1-S16 and second switches S21-S36.

The current sources CS1-CS16 are constant current sources capable of supplying currents corresponding to respective steps indicated by Δ1-Δ16. Each step is an incremental amplitude of the sinusoidal wave for one step phase change of π/16. According to an exemplary embodiment of the present disclosure, this incremental amplitude for each current source may be different from each other. That is, though the reference current source CS0 and the sixteen current sources CS1-CS16 are connected in a same way as a current mirror in the drawing, the magnitudes of the currents supplied by all or at least some of the sixteen current sources CS1-CS16 are different from the current of other current sources. For example, as can be inferred from grid lines in the left portion of FIG. 4, the current sources CS7-CS10 in the middle can supply more currents than the current sources CS1, CS2, CS15, and CS16 at both edges. Such nonlinear characteristics can be implemented by mapping linear input values nonlinearly with the current values of the current sources CS1-CS16 during a circuit design stage and determining the sizes, e.g. aspect ratios of channels, of the transistors constituting the current sources CS1-CS16 to match the nonlinear current values.

First terminals of the first switches S1-S16 are connected to an output terminal ODAC_I of the nonlinear DAC 220A, second terminals of the first switches S1-S16 are connected to an inverted output terminal /ODAC_I of the nonlinear DAC 220A, and common terminals of the first switches S1-S16 are connected to first terminals of respective second switches S21-S36. Second terminals of the second switches S21-S36 are connected to an output node of the linear interpolation DAC 230A, and common terminals of the second switches S21-S36 are connected to the drains of the current sources CS1-CS16, respectively.

The linear interpolation DAC 230A includes four transistor pairs, each of which operates as a pass transistor. Gates of each transistor pair receive one bit of the four LSBs B0-B3 of the residual signal, i.e. the effective input signal after the symmetric transformation, or its inverted value /B0-/B3. In each of the transistor pairs, the drain of the transistor of which gate receives a corresponding bit of the effective input signal B0-B3 is connected to the inverted output terminal /ODAC_I, and the drain of the remaining transistor is connected to the output terminal ODAC_I. The source of each transistor of the transistor pairs is connected to the output node 240 of the linear interpolation DAC 230A. In addition, the linear interpolation DAC 230A may further include a dummy transistor having a source connected to the output node 240 of the linear interpolation DAC 230A, a drain connected to the inverted output terminal /ODAC_I, and a gate to which a bias voltage VDD is applied.

In the conversion circuit 210, each of the first switches S1-S16 receives, as a switching control signal, one bit of a thermometer code for the four MSBs B4-B7 of the linear data signal, i.e. the effective input signal after the symmetric transformation. Accordingly, the switching of each of the first switches S1-S16 is controlled by a corresponding bit of thermometer code. In a switching example shown in FIG. 5, thermometer code has a value of '0000000000000011', so that two current sources CS1 and CS2 supply current through the output terminal ODAC_I (i.e. draw current from the output terminal ODAC_I) and thirteen current sources S4-S16 supply current through the inverted output terminal /ODAC_I (i.e. draw current from the inverted output terminal /ODAC_I). The other current source S3 supplies current to the output terminal ODAC_I and the inverted output terminal /ODAC_I through the linear interpolation DAC 230A.

Figure 6:
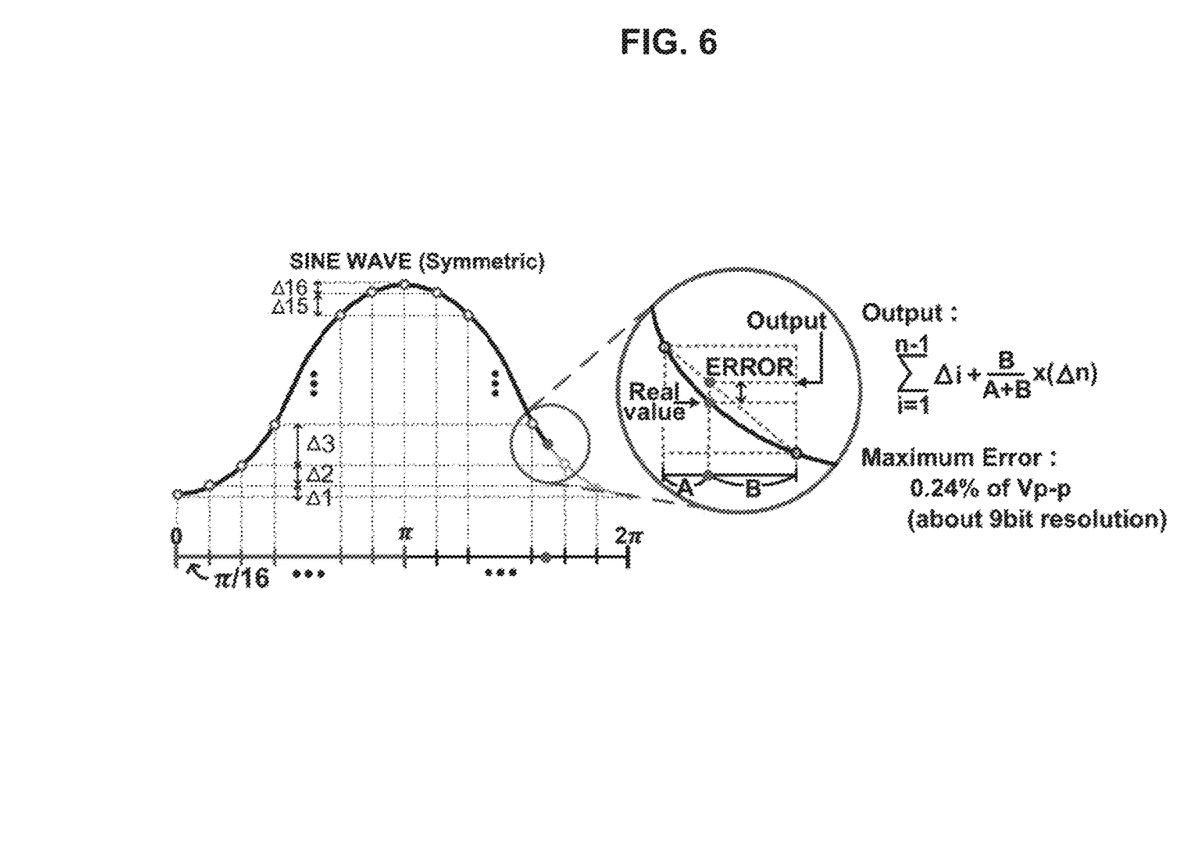
FIG. 6 illustrates a principle of an interpolation operation in a linear interpolation digital-to-analog converter.

Here, the linear interpolation DAC 230A interpolates the output current to compensate for the low output resolution of the nonlinear DAC 220A. For example, when the conversion circuit 210 generates the sinusoidal wave shown on the left portion of FIG. 6, if only the two current sources CS1 and CS2 are connected to the output terminal ODAC_I to supply a current of Δ1+Δ2 which is the sum of the currents of current sources CS1 and CS2 to the output terminal ODAC_I, there is a significant error between the amount of current to be delivered and the actual amount of current. According to the present embodiment, the linear interpolation DAC 230A interpolates the current in the section by a second term of a following equation assuming that the magnitude of current does not significantly deviate from a linear change with time.

$$i = \sum_{i=1}^{n-1} \Delta i + \frac{B}{A+B} \times (\Delta n) \qquad \text{[Equation 1]}$$

In FIG. 5, the linear interpolation DAC 230A outputs the currents flowing each transistor pair and the dummy transistor through the output node 240 according to the residual signal. The output node 240 of the linear interpolation DAC 230A is connected to only one current source among the current sources S1-S16 in the nonlinear DAC 220A. The current source connected to the output node 240 of the linear interpolation DAC 230A is a current source corresponding to the least significant bit among the bits having values of '0' in thermometer code, i.e., the third current source CS3 in the above example. Therefore, the currents flowing the transistor pairs and the dummy transistor in the linear interpolation DAC 230A flow through the third current source CS3, and the current flowing through the third current source CS3 is fractionalized between the output terminal ODAC_I and the inverted output terminal /ODAC_I to interpolate the output current of the nonlinear DAC 220A.

If the interpolation is performed as above, in a section where the sinusoidal wave changes most rapidly, the error caused by the linear interpolation is not so high because the slope change is not large. On the other hand, in a section where the slope change is the largest, the error caused by the linear interpolation is not so high because the actual output change is small. Thus, the combination of the nonlinear DAC and the linear interpolation DAC enables to obtain high resolution using the minimum number of input bits. Therefore, the conversion circuit according to an exemplary embodiment may be advantageous in the operation speed. Since the linear interpolation DAC 230A works only for one section or one stage of the current sources in the nonlinear DAC, the conversion circuit does not increase the complexity of the overall device structure, and the effect of the system complexity has little or no effect on the operation speed.

Figure 7:
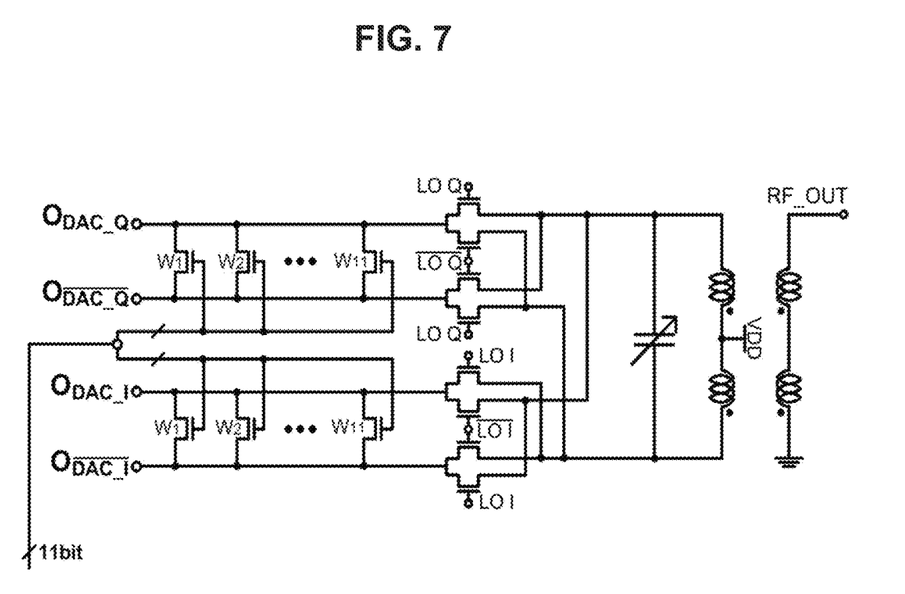
FIG. 7 is a circuit diagram of a waveform shaping circuit and an output circuit according to an exemplary embodiment of the present disclosure.

FIG. 7 is a circuit diagram of the waveform shaping circuit 240 and the output circuit 250 according to an exemplary embodiment of the present disclosure.

The waveform shaping circuit 240 shapes the waveform of the converted analog signal output by the conversion circuit 210 for a better spectral isolation between pulses of different frequencies. According to an exemplary embodiment of the present disclosure, the waveform shaping circuit 240 the waveform shaping circuit 240 performs the shunt-based amplitude waveform shaping that approximates the converted analog signal by the discrete cosine function for the case of a higher roll-off coefficient (i.e. close to 1) to simplify the circuit implementation.

The waveform shaping circuit 240 is connected to the I-component output terminal (ODAC_I), the inverted I-component output terminal (/ODAC_I), the Q-component output terminal (ODAC_Q), and the inverted Q-component output terminal (/ODAC_Q) of the conversion circuit 210. Transistor pairs for mixing the local oscillation signals LO_I and /LO_I are disposed between the I-component output terminal ODAC_I and the inverted I-component output terminal ODAC_I. Also, transistor pairs for mixing the local oscillation signals LO_Q and /LO_Q are disposed between the Q-component output terminal ODAC_Q and the inverted Q-component output terminal /ODAC_Q. The transistor pairs frequency-modulate the local oscillation signals according to the output signal of the conversion circuit 210 and supply a nonlinear high-frequency signal to the output circuit 250.

Meanwhile, a plurality of (e.g. eleven in the present embodiment) shunt transistors W1-W11 are disposed between the I-component output terminal ODAC_I and the inverted output terminal ODAC_I. Similarly, a plurality of shunt transistors W1-W11 are disposed between the Q-component output terminal ODAC_Q and the inverted Q-component output terminal /ODAC_Q. Gates of the shunt transistors W1-W11 receive respective bits of the raised cosine code output by the raised cosine code generator 140. The shunt transistors W1-W11 bypass the output current to reduce the current contributing to the mixing, thereby resulting in an effective pulse shaping. That is, at least some of the shunt transistors W1-W11 are in incomplete conduction states according to the bit values of the raised cosine code and perform shunt operations. As the difference between the I-component output signal and the inverted I-component output signal decreases and the magnitude of the I-component output signal decreases, the envelope of the waveform shaped signal output by the waveform shaping circuit 240 is narrowed and widened repeatedly.

Figure 8:
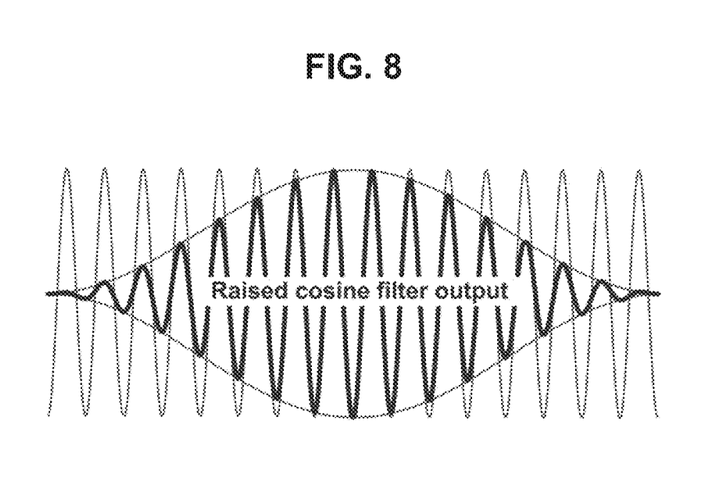
FIG. 8 is a waveform diagram illustrating an example of a waveform shaping signal output by the waveform shaping circuit of FIG. 7.

The raised cosine code generator 140 and the shunt transistors W1-W11 of the waveform shaping circuit 240 are particularly useful when the nonlinear waveform signal generator of the present disclosure is applied to a quantum computer, but the present disclosure is not limited thereto. In another embodiments, the raised cosine code generator 140 and the shunt transistors W1-W11 of the waveform shaping circuit 240 may be omitted. In such a case, the waveform shaping circuit 240 and the nonlinear waveform signal generating device may output a typical periodic waveform signal rather than a signal in which a high-frequency signal burst is trapped within the envelope as shown in FIG. 8.

The output circuit 250 shown in FIG. 7 includes a primary winding and a secondary winding magnetically coupled to each other. Inductors and a variable capacitor in the primary winding constitute a filter suitable for removing an unnecessary sidebands of the local oscillation signal and allowing only a desired sideband to pass. In the exemplary circuit illustrated in the drawing, a center tap of the primary winding is provided with a bias voltage VDD, which biases the current sources CS1-CS16 of the conversion circuit 210 through the I-component and Q-component output terminals and their inverted output terminals ODAC_I, /ODAC_I, ODAC_Q, /ODAC_Q. In an alternative embodiment, however, a resistor may be disposed instead of the magnetically coupled primary and secondary windings, and a voltage drop across the resistor may be used as an output voltage.

Figure 9:
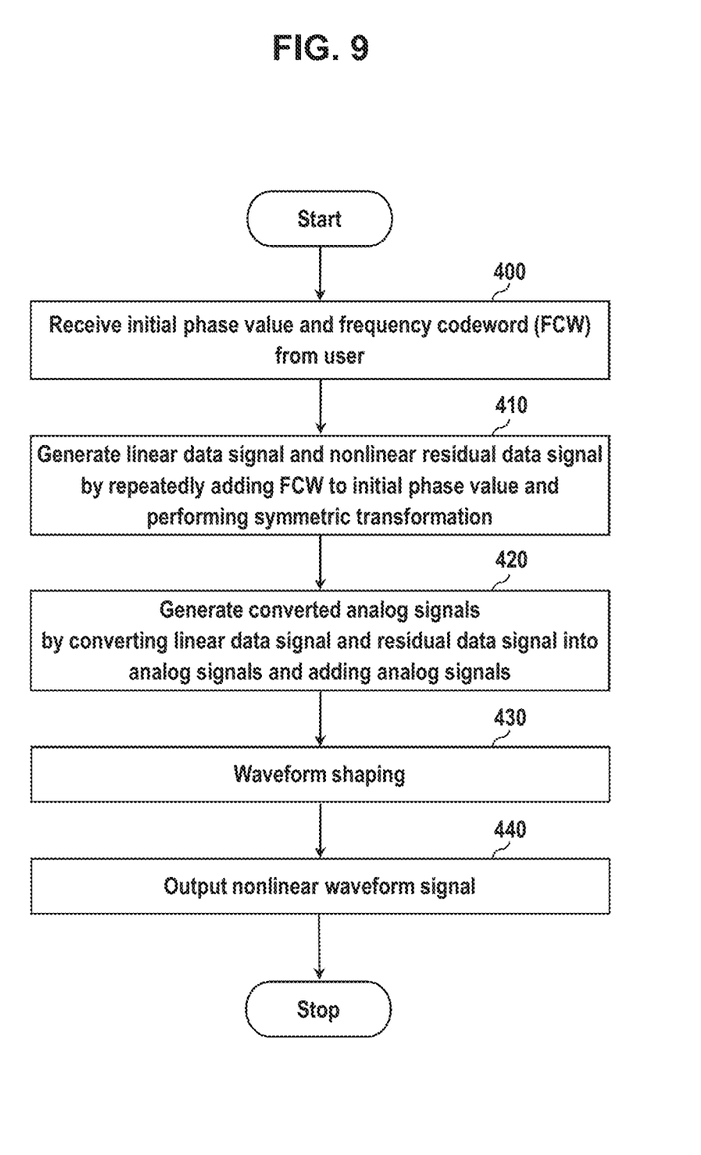
FIG. 9 is a flowchart showing an operation of the nonlinear waveform signal generating device according to an exemplary embodiment of the present disclosure.

FIG. 9 is a flowchart showing an operation of the nonlinear waveform signal generating device according to an exemplary embodiment of the present disclosure. The operation of the nonlinear waveform signal generating device will now be described with reference to FIG. 9.

When the user inputs the initial phase value φ0 and the frequency codeword (FCW) and starts the operation of the device (operation 400), the frequency codeword is consecutively added and accumulated to the initial phase value φ0 stored in the memory 110. When the accumulated value reaches the upper limit, the upper limit is subtracted from the accumulated value and the accumulation of the frequency codeword continues from the remaining value after the subtraction. Accordingly, the accumulated value is repeatedly increased from around zero to slightly above the upper limit. In case that the nonlinear waveform is a symmetric waveform, the symmetric transformation is performed for the rotationally accumulated value to invert the rotationally accumulated value every other period. Subsequently, the linear data signal is obtained by quantizing the effective input signal after the symmetric transformation, and the residual signal is obtained from the difference between the effective input signal and the linear data signal (operation 410).

The upper limit of the rotationally accumulated value corresponds to a half of the phase variation range of the nonlinear waveform. Also, the magnitude of the frequency codeword determines the frequency of the nonlinear waveform. According to the example shown in FIG. 4, the frequency codeword has a value of about $\pi/6$. Accordingly, one period of the rotationally accumulated value and the nonlinear waveform is twelve clock cycles. If the nonlinear waveform signal generator operates at a clock of 2 GHz as shown in FIG. 3, the frequency of the nonlinear waveform is about 167 MHz (=2 GHz/12). Larger the frequency codeword is, shorter the clock cycles corresponding to one period of the nonlinear waveform is.

In operation 420, the linear data signal is applied to the nonlinear DAC 220 as a thermometer code and is converted into an analog signal. Also, the residual signal is applied to the linear interpolation DAC 230 to be converted into an analog signal and added to the output signal of the nonlinear DAC 220 to generate the converted analog signal.

Then, the converted analog signal is subjected to a waveform shaping using the raised cosine filtering by the waveform shaping circuit 240 (operation 430). The waveform-shaped signal may be filtered and output as the nonlinear waveform signal through the transformer (operation 440).

Figure 10:
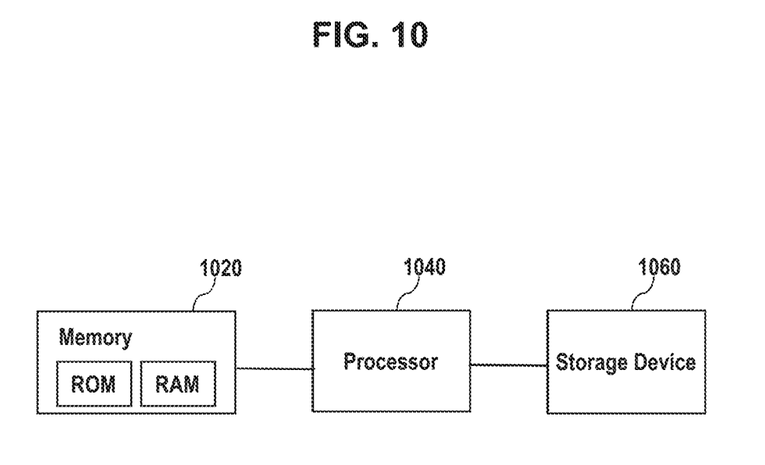
FIG. 10 is a block diagram of a digital preprocessor according to an exemplary embodiment of the present disclosure.

FIG. 10 is a block diagram of the digital preprocessor 100 according to an exemplary embodiment of the present disclosure. The digital preprocessor 100 according to an exemplary embodiment of the present disclosure may include at least one processor 1020, a memory 1040, and a storage device 1060.

The processor 1020 may execute program instructions stored in the memory 1040 and/or the storage 1060. The processor 1020 may include a central processing unit (CPU) or a graphics processing unit (GPU), or may be implemented by another kind of dedicated processor suitable for performing the method of the present disclosure.

The memory 1040 may load the program instructions stored in the storage 1060 to provide to the processor 1020. The memory 1040 may include, for example, a volatile memory such as a read only memory (ROM) and a non-volatile memory such as a random access memory (RAM).

The storage device 1060 may store the program instructions that can be loaded to the memory 1040 and executed by the processor 1020. The program instructions stored in the storage device 1060 may include program instructions required for implementing the digital preprocessor 100 shown in FIG. 3. The program instructions may be loaded into the memory 1040 under the control of the processor 1020 and executed by the processor 1020 to implement the method of generating the nonlinear waveform signal according to the present disclosure.

The storage device 1060 may include an intangible recording medium suitable for storing the program instructions, data files, data structures, and a combination thereof. Examples of the storage medium may include magnetic media such as a hard disk, a floppy disk, and a magnetic tape, optical media such as a compact disk read only memory (CD-ROM) and a digital video disk (DVD), magneto-optical medium such as a floptical disk, and semiconductor memories such as ROM, RAM, a flash memory, and a solid-state drive (SSD).

Meanwhile, in FIG. 3 which shows the functions of the digital preprocessor 100, the modules, service units, and database tables do not need to be implemented in units of the illustrated names. In other words, a plurality of modules or service units may be incorporated or grouped into a different arrangement. The same are the database tables.

As described above, according to an embodiment of the present disclosure, the linear data signal is converted into an analog signal by a nonlinear DAC. According to an exemplary embodiment, the number of bits of data input to the nonlinear DAC is only four, but the effective resolution of the output is much finer. This can be done by defining the 16 nonlinear steps by the user. The four bits of data may be translated into a sixteen-bit thermometer code which is used as control inputs of the nonlinear DAC. The differential switching of current sources contributes to the development of a differential output. In addition, the residual signal is applied to the linear interpolation DAC, which generates a residue to be added to the output of the nonlinear DAC to interpolate the output of the nonlinear DAC. A simulation showed that the error caused by the linear interpolation is 0.24%. Thus, an effective resolution of about 9 bits can be obtained by a combination of the nonlinear DAC and the linear interpolation DAC though the number of DAC inputs is only 8 including 4 MSBs and 4 LSBs. There may be additional current sources connected in parallel with each current source. These extra current sources may be used for a calibration providing a tuning range of 20% with an 11-bit resolution.

The inventors implemented an integrated circuit (IC) chip for the nonlinear waveform signal generator with 40 nm CMOS process. The fabricated IC included six pulse modulators and transmitters that use the same local oscillation frequency as each other and operate independently.

The manufactured IC was tested at two DAC sampling rates of 1 GS/s and 2 GS/s. At 1 GS/s, the image rejection ratio (IRR) was greater than 42 dB and the LO rejection ratio (LORR) was greater than 41 dB. The IC can perform a burst synthesis of different frequencies simply by changing frequency codeword value in the memory. It was verified by measuring waveforms and spectrums when consecutive 200 ns pulses are applied with a 50 MHz step. The inventors applied the frequency codewords for two cases of rectangular and raised cosine shapes and found that the latter showed a better spectral selectivity. All the results described above were measured at 77 K by putting the PCB in liquid nitrogen under test environment established by the inventors.

The inventors also tested the IC using an actual quantum processor sitting in 10 mK. A transmon qubit of a 5.123 GHz-resonance was connected to the IC through a cable. A Rabi experiment was conducted by measuring the qubit state with an increase of the pulse width. To verify the phase coherence, Ramsey experiment was also performed by measuring the qubit state after a $\pi/2$-rotation with respect to x-axis followed by a $-\pi/2$-rotation with respect to the x-axis after a variable time gap for free evolution. A frequency detuning of +2 MHz (5.125 GHz) was applied for the Ramsey experiment. The measurement results were compared with those obtained using a commercial vector microwave signal generator (VSG) equipment at room temperature, and the comparison result revealed an excellent coincidence between them. Compared with conventional controller ICs, the architecture according to the present disclosure provides all the required functions while achieving a more than 60-fold improvement in power consumption. Thus, the scheme of the present disclosure is believed to be promising for a realization of a fault-tolerant scalable quantum computer.

Some aspects of the present disclosure described above in the context of the device may indicate corresponding descriptions of the method according to the present disclosure, and the blocks or devices may correspond to operations of the method or features of the operations. Similarly, some aspects described in the context of the method may be expressed by features of blocks, items, or devices corresponding thereto. Some or all of the operations of the method may be performed by use of a hardware device such as a microprocessor, a programmable computer, or electronic circuits, for example. In some exemplary embodiments, one or more of the most important operations of the method may be performed by such a device.

In some exemplary embodiments, a programmable logic device such as a field-programmable gate array may be used to perform some or all of functions of the methods described herein. In some exemplary embodiments, the field-programmable gate array may be operated with a microprocessor to perform one of the methods described herein. In general, the methods are preferably performed by a certain hardware device.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A nonlinear waveform signal generating device, comprising:
    a digital preprocessing unit configured to quantize an effective input signal to generate a linear data signal and a residual signal that is a difference between the effective input signal and the linear data signal;
    a nonlinear digital-to-analog conversion circuit (DAC) having a nonlinear relationship between an input and an output and configured to convert the linear data signal into a first analog signal;
    a linear interpolation DAC configured to convert the residual signal into a second analog signal to enable a generation of a converted analog signal by an addition of the second analog signal to the first analog signal; and
    an output circuit configured to output the converted analog signal as a nonlinear waveform signal.

2. The nonlinear waveform signal generating device of claim 1, wherein the nonlinear DAC comprises:
    a reference current source; and
    a plurality of current sources each being activated according to a corresponding bit of a thermometer code, wherein a number of the current sources is the same as a number of bits of thermometer code for the linear data signal and output currents of at least some of the plurality of current sources are different from each other,
    wherein the linear interpolation DAC is connected to one of the plurality of current sources at a first activated position or a last deactivated position.

3. The nonlinear waveform signal generating device of claim 2, wherein the linear interpolation DAC provides the second analog signal to the nonlinear DAC for an interpolation of a single step of the linear data signal.

4. The nonlinear waveform signal generating device of claim 1, further comprising:
a waveform shaping circuit configured to shaping a waveform of the converted analog signal.

5. The nonlinear waveform signal generating device of claim 4, further comprising:
a mixer configured to perform a frequency modulation of the converted analog signal by mixing the converted analog signal with a local oscillation signal.

6. The nonlinear waveform signal generating device of claim 5, further comprising:
a raised cosine code generator configured to provide a raised cosine code to the waveform shaping circuit.

7. The nonlinear waveform signal generating device of claim 1, further comprising:
a rotational phase accumulator configured to generate the effective input signal based on an initial phase value and a frequency codeword input by a user.

8. The nonlinear waveform signal generating device of claim 7, wherein the rotational phase accumulator generates rotationally accumulated values, as the effective input signal, that are calculated by repeatedly adding the frequency codeword within a predetermined phase value range starting from the initial phase value.

9. The nonlinear waveform signal generating device of claim 8, further comprising:
a symmetric transformation unit configured to perform a symmetric transformation on the rotationally accumulated value in a predetermined bi-periodic unit with respect to a half level of a maximum value of the rotationally accumulated value to facilitate an acquisition of the linear data signal from a symmetrically transformed signal.

10. The nonlinear waveform signal generating device of claim 7, wherein the rotational phase accumulator generates the effective input signal by taking only a certain number of most significant bits from a rotationally accumulated value that is calculated by repeatedly adding the frequency codeword within a predetermined phase value range starting from the initial phase value.

11. The nonlinear waveform signal generating device of claim 10, wherein the linear data signal is obtained by newly quantizing the effective input signal.

12. A method of generating a nonlinear waveform signal, comprising:
(a) generating an effective input signal repeatedly increasing within a predetermined range at a regular time interval starting from an initial phase value input by a user;
(b) quantizing the effective input signal to obtain a linear data signal and a residual signal that is a difference between the effective input signal and the linear data signal;
(c) converting the linear data signal into a first analog signal by a nonlinear DAC having a nonlinear relationship between an input and an output, converting the residual signal into a second analog signal, and adding the second analog signal to the first analog signal to generate the converted analog signal; and
(d) outputting the converted analog signal as a nonlinear waveform signal.

13. The method of claim 12, wherein the second analog signal is generated for an interpolation of a single step of the linear data signal.

14. The method of claim 12, wherein the nonlinear DAC comprises a plurality of current sources each being activated according to a corresponding bit of a thermometer code,
wherein a number of the current sources is the same as a number of bits of thermometer code for the linear data signal and output currents of at least some of the plurality of current sources are different from each other,
wherein the operation (c) comprises:
adding the second analog signal to a fractionalized path of a selected one of the current sources.

15. The method of claim 12, further comprising:
(e) shaping a waveform of the converted analog signal.

16. The method of claim 15, wherein the operation (e) comprises:
performing a frequency modulation of the converted analog signal by mixing a local oscillation signal to the converted analog signal; and
shaping a waveform of a frequency-modulated signal by a raised cosine filtering of the frequency-modulated signal.

17. The method of claim 16, wherein shaping the waveform of the frequency-modulated signal comprises:
shunting a signal line of the converted analog signal according to bits of a raised cosine code.

18. The method of claim 12, wherein the operation (a) comprises:
generating rotationally accumulated values, as the effective input signal, that are calculated by repeatedly adding the frequency codeword input by the user starting from the initial phase value.

19. The method of claim 18, wherein the operation (a) further comprises:
taking only a certain number of most significant bits from the rotationally accumulated value; and
performing a symmetric transformation on the rotationally accumulated value with respect to a half level of a maximum value of the rotationally accumulated value.

* * * * *